(12) United States Patent
Kim et al.

(10) Patent No.: US 7,554,361 B2
(45) Date of Patent: Jun. 30, 2009

(54) LEVEL SHIFTER AND METHOD THEREOF

(75) Inventors: Nyun-Tae Kim, Yongin-si (KR); Ki-Hong Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 358 days.

(21) Appl. No.: 11/175,415

(22) Filed: Jul. 7, 2005

(65) Prior Publication Data

US 2006/0012396 A1 Jan. 19, 2006

(30) Foreign Application Priority Data

Jul. 16, 2004 (KR) .................. 10-2004-0055482

(51) Int. Cl.
*H03K 19/0175* (2006.01)
(52) U.S. Cl. .................. 326/81; 326/68; 326/71
(58) Field of Classification Search .............. 327/436, 327/333; 326/71, 68, 62, 80, 81, 22, 23, 326/24; 361/56
See application file for complete search history.

(56) References Cited

U.S. PATENT DOCUMENTS

| 4,459,498 | A | * | 7/1984 | Stengl et al. .................. 327/436 |
| 5,036,226 | A | * | 7/1991 | Tonnu et al. .................. 326/71 |
| 5,304,872 | A | * | 4/1994 | Avraham et al. .............. 326/71 |
| 5,512,844 | A | * | 4/1996 | Nakakura et al. ............. 326/81 |
| 5,883,528 | A | * | 3/1999 | Kashmiri et al. .............. 326/71 |
| 6,031,393 | A | * | 2/2000 | Wayner ........................ 326/81 |
| 6,034,549 | A | | 3/2000 | Matsumoto et al. |
| 6,069,493 | A | * | 5/2000 | Pigott et al. .................. 326/83 |
| 6,249,410 | B1 | * | 6/2001 | Ker et al. ..................... 361/56 |
| 6,329,841 | B1 | | 12/2001 | Kim |
| 6,717,453 | B2 | | 4/2004 | Aoki |
| 6,850,090 | B2 | * | 2/2005 | Aoki ........................... 326/68 |
| 2005/0140421 | A1 | * | 6/2005 | Shin ........................... 327/333 |

FOREIGN PATENT DOCUMENTS

| JP | 01-213022 | 8/1999 |
| KR | 1999-0050092 | 7/1999 |
| KR | 2002-0032281 | 5/2002 |
| KR | 10-2004-0006766 | 1/2004 |

* cited by examiner

*Primary Examiner*—James H. Cho
*Assistant Examiner*—Crystal L Hammond
(74) *Attorney, Agent, or Firm*—Harness, Dickey & Pierce, PLC

(57) ABSTRACT

A level shifter and method thereof. The level shifter may include a protective circuit configured to receive an input signal having an input voltage level, the input signal received on an input line, the protective circuit reducing the input voltage level to generate a stabilized input signal and a first inverter configured to invert the stabilized input signal and to output an inverted output signal at an inverted output voltage level to a first node. In an example method, an input signal may be received at an input voltage level, the input voltage level may be reduced to output a stabilized input signal, the stabilized input signal may be inverted to output an inverted output signal at an inverted output voltage level to a first node and the first node may be transitioned to a node voltage level based on the input signal. The level shifter and method thereof may reduce a power consumption and/or a chip size of a semiconductor device.

32 Claims, 11 Drawing Sheets

LEVEL SHIFTER AND METHOD THEREOF

PRIORITY STATEMENT

This application claims priority under 35 USC § 119 to Korean Patent Application No. 2004-55482, filed on Jul. 16, 2004, the disclosure of which is incorporated herein in its entirety by reference.

BACKGROUND OF THE INVENTION

1. Field of the Invention

The present invention relates to a semiconductor integrated circuit and method thereof, and more particularly to a level shifter and method thereof.

2. Description of the Related Art

A semiconductor integrated circuit may include a main function circuit block and an interface circuit block for interfacing with external circuits. The integrated circuit block may include logic blocks operating at different supply voltages. For example, certain logic blocks may use a lower supply voltage (e.g., less than 1.2V) while other logic blocks (e.g., analog logic blocks) of the semiconductor interface circuit may use a higher supply voltage (e.g., between 2.5V and 3.3V).

Logic blocks operating at different supply voltages may include a level shifter for interfacing with other logic blocks. The level shifter may occupy a given amount of surface area on a chip and may consume a given amount of power. In a semiconductor integrated circuit with a higher integration level, the level shifter may limit an amount of gate length scaling which may thereby limit a reduction to a chip size and/or power consumption of the semiconductor integrated circuit.

FIG. 1 illustrates a circuit diagram of a conventional level shifter 100. Referring to FIG. 1, the conventional level shifter 100 may include a level shift portion 1 and a signal selection portion 2. The level shift portion 1 may include inverters 11 and 12 and a level shifter flip-flop 13. The level shifter flip-flop 13 may receive and latch an input signal A and an inverted input signal from the inverter 12. The output of the level shifter flip-flop 13 may be inverted by transistors MP24 and MN25 to output an output signal Y. The output signal Y of the level shifter 100 may have a first voltage level (e.g., a higher voltage level) which may be higher than a second voltage level (e.g., a lower voltage level) of the input signal A. A supply voltage VDD2 may correspond to the first voltage level of the output signal Y. The supply voltage VDD2 may be at a higher voltage level than a supply voltage VDD1.

The conventional level shifter 100 may include a latch circuit and a number of additional transistors to adjust a voltage level of the input signal A at a higher frequency (e.g., several gigahertz). The conventional level shifter 100 may also adjust a voltage level of the input signal A at a lower frequency (e.g., less than several hundred megahertz).

SUMMARY OF THE INVENTION

An example embodiment of the present invention is directed to a level shifter, including a protective circuit configured to receive an input signal having an input voltage level, the input signal received on an input line, the protective circuit reducing the input voltage level to generate a stabilized input signal and a first inverter configured to invert the stabilized input signal to output an inverted output signal at an inverted output voltage level to a first node.

Another example embodiment of the present invention is directed to a method of level shifting, comprising receiving an input signal at an input voltage level, reducing the input voltage level to output a stabilized input signal, inverting the stabilized input signal to output an inverted output signal at an inverted output voltage level to a first node and transitioning the first node to a node voltage level based on the input signal.

BRIEF DESCRIPTION OF THE DRAWINGS

The accompanying drawings are included to provide a further understanding of example embodiments of the invention, and are incorporated in and constitute a part of this specification. The drawings illustrate example embodiments of the present invention and, together with the description, serve to explain principles of example embodiments of the present invention.

DETAILED DESCRIPTION OF EXAMPLE EMBODIMENTS OF THE PRESENT INVENTION

Figure 1:
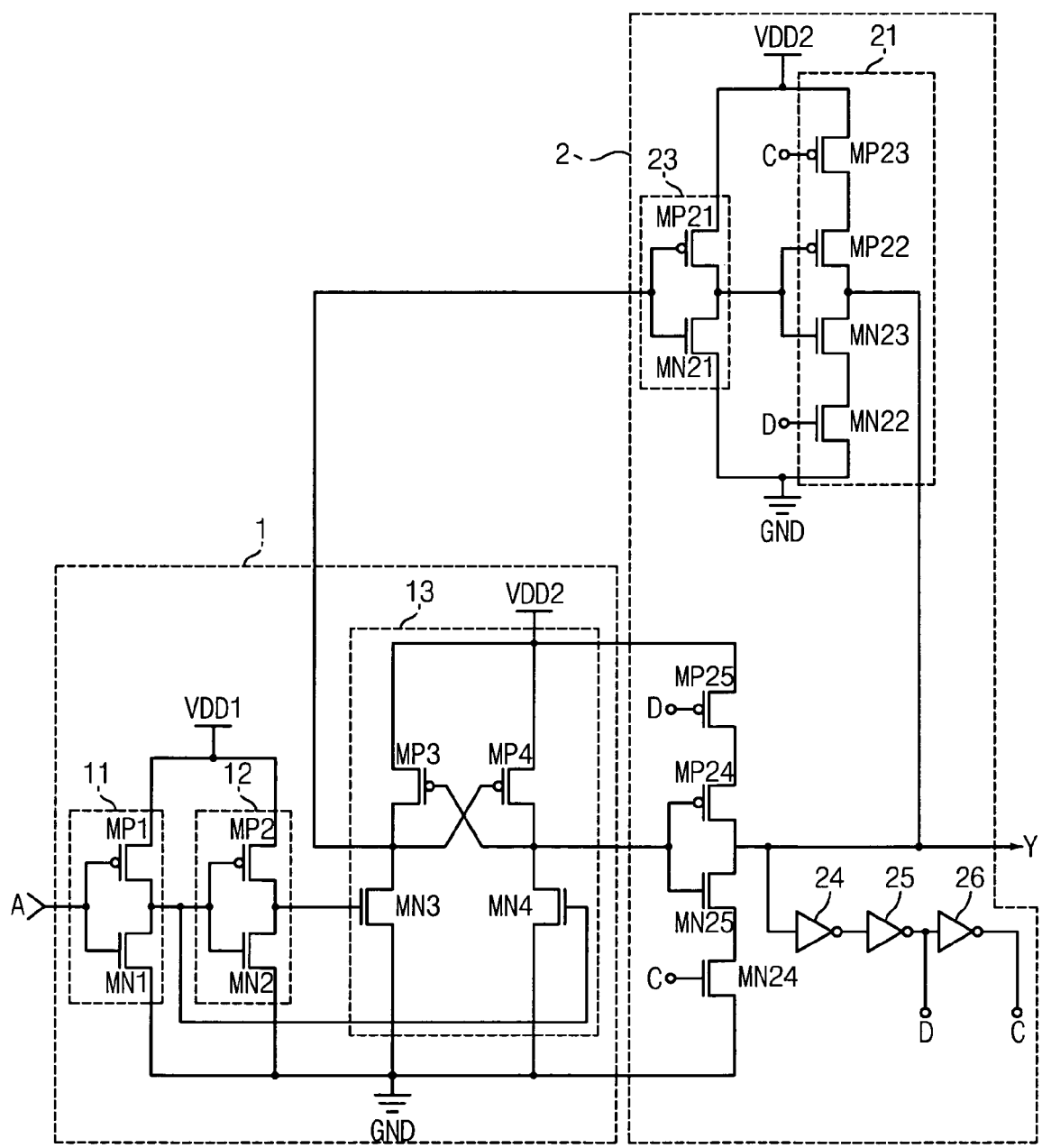
FIG. 1 illustrates a circuit diagram of a conventional level shifter.

Hereinafter, example embodiments of the present invention will be described in detail with reference to the accompanying drawings.

In the Figures, the same reference numerals are used to denote the same elements throughout the drawings.

Figure 2:
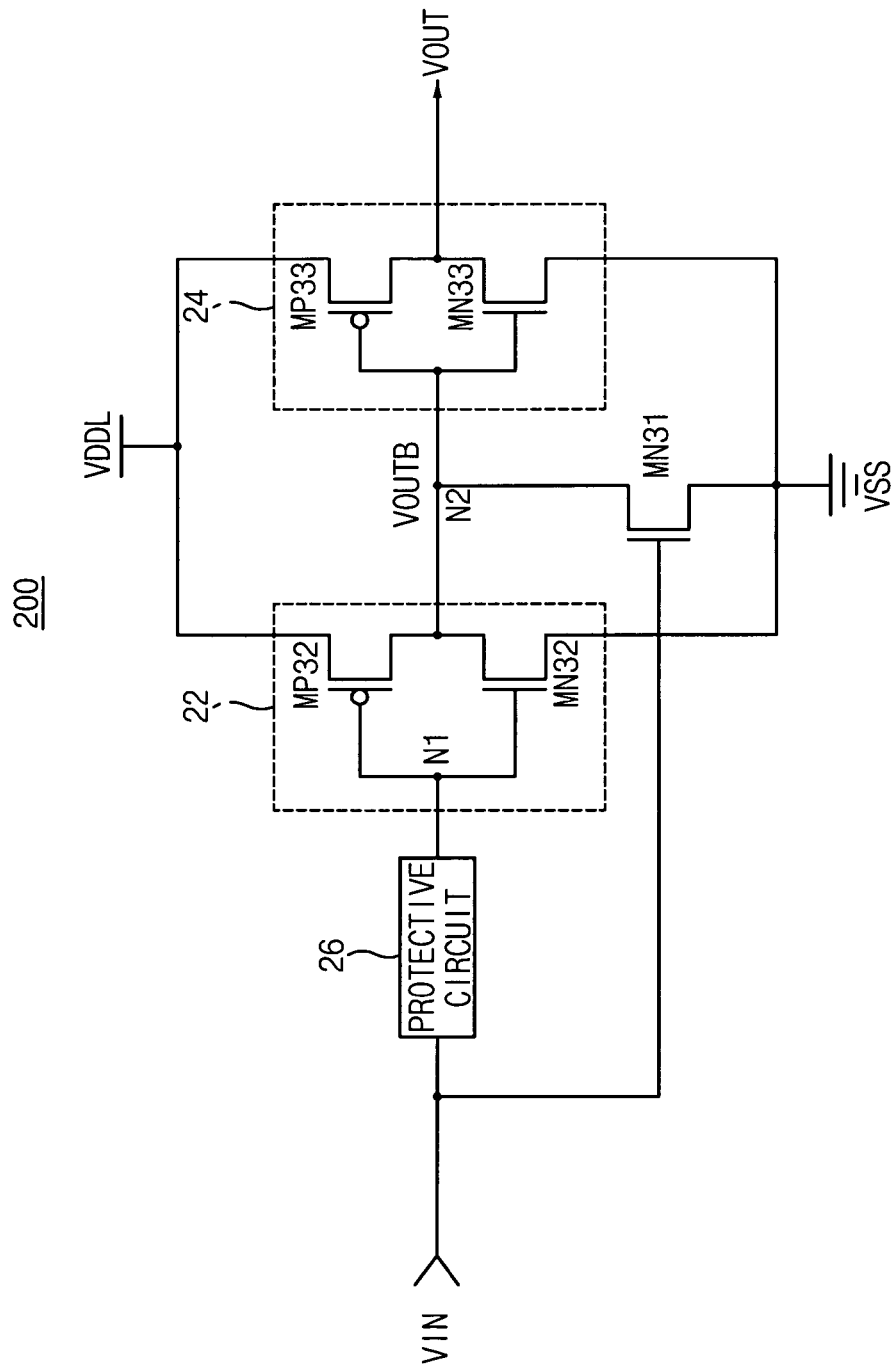
FIG. 2 is a block diagram illustrating a level shifter according to an example embodiment of the present invention.

FIG. 2 is a block diagram illustrating a level shifter 200 according to an example embodiment of the present invention.

In the example embodiment of FIG. 2, the level shifter 200 may receive an input signal VIN and may output an output signal VOUT at a lower voltage level than the input signal VIN. The level shifter 200 may include a protective circuit 26, a first inverter 22, a second inverter 24 and an N type metal oxide semiconductor (NMOS) transistor MN31.

In the example embodiment of FIG. 2, the protective circuit 26 may receive the input signal VIN at a given voltage level between a first voltage level (e.g., 3.3V) and a second voltage level (e.g., 0V) through an input line and may output an output signal at a voltage level lower than the input signal VIN by a given amount at a node N1.

In the example embodiment of FIG. 2, the first inverter 22 may receive and invert the output signal received from the protective circuit 26 to output an inverted output signal VOUTB that may have a voltage level between the second voltage level and a third voltage level (e.g., 1.2V) at a node N2.

In the example embodiment of FIG. 2, the second inverter 24 may receive and invert the inverted output signal VOUTB and may output the voltage signal VOUT having a voltage level between the second and third voltage levels to an output line.

In the example embodiment of FIG. 2, the NMOS transistor MN31 may set a voltage level at the node N2 to the second voltage level (e.g., 0V) based on the input signal VIN.

In the example embodiment of FIG. 2, the first inverter 22 may include a P-type metal oxide semiconductor (PMOS) transistor MP32 and an NMOS transistor MN32. The PMOS transistor MP32 may have a gate for receiving the output signal of the protective circuit 26, a source coupled to a first supply voltage and a drain coupled to the node N2. The NMOS transistor MN32 may have a gate for receiving the output signal of the protective circuit 26, a source coupled to a second supply voltage and a drain coupled to the node N2. For example, the first supply voltage may correspond to a power supply VDDL and the second supply voltage may correspond to a voltage VSS (e.g., a ground voltage).

In the example embodiment of FIG. 2, the second inverter 24 may include a PMOS transistor MP33 and an NMOS transistor MN33. The PMOS transistor MP33 may have a gate for receiving the inverted output signal VOUTB from the first inverter 22, a source coupled to the first supply voltage and a drain coupled to the output line. The NMOS transistor MN33 may have a gate for receiving the inverted output signal VOUTB, a source coupled to the second supply voltage and a drain coupled to the output line. The first supply voltage (e.g., VDDL) may have a voltage level corresponding to the third voltage level (e.g., 1.2V, a lower voltage level than the first voltage level, etc.).

Figure 3:
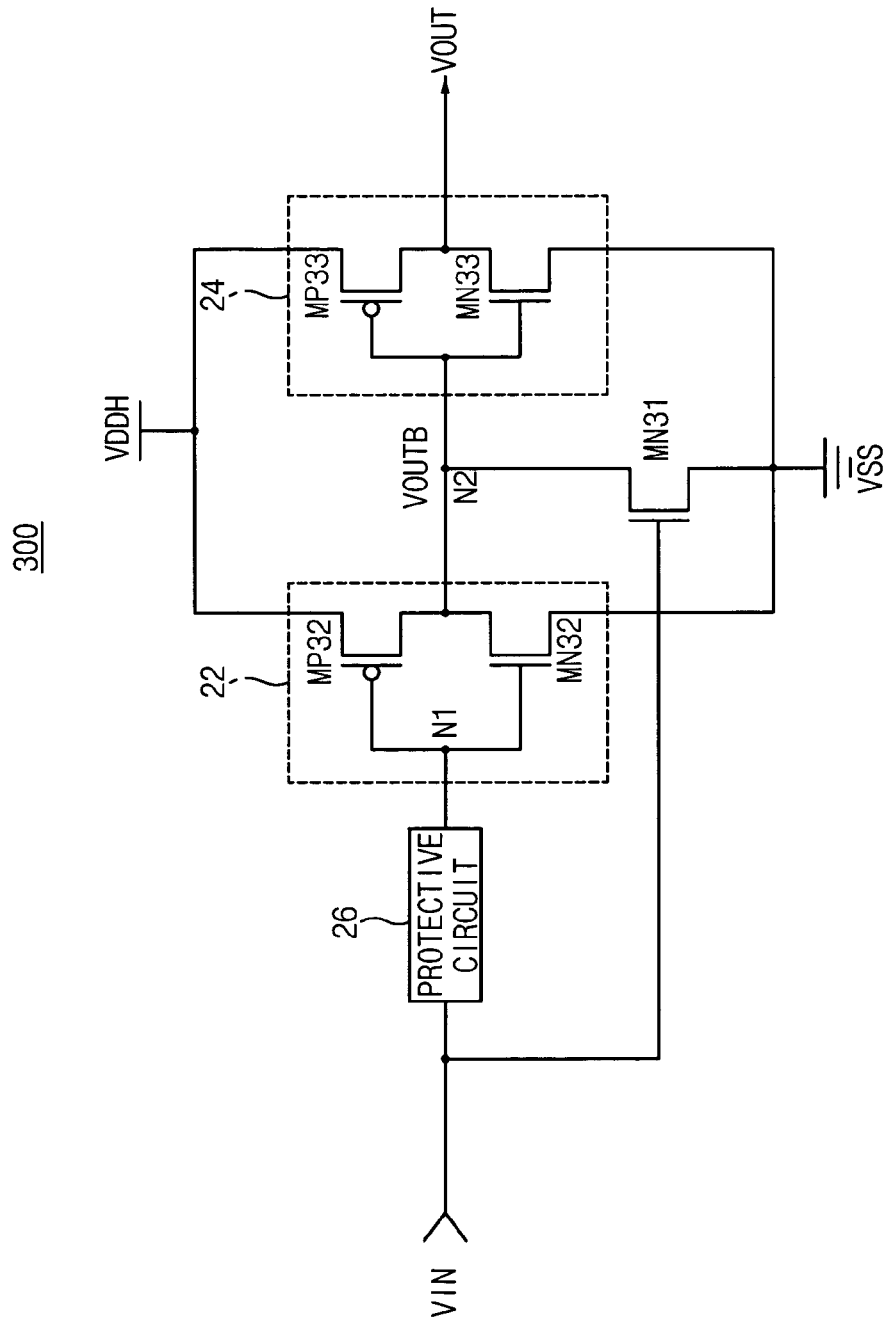
FIG. 3 is a block diagram illustrating a level shifter according to another example embodiment of the present invention.

FIG. 3 is a block diagram illustrating a level shifter 300 according to another example embodiment of the present invention.

In the example embodiment of FIG. 3, the level shifter 300 may include the elements of the level shifter 200 as discussed above with respect to FIG. 2 except that the level shifter 300 may output the output signal VOUT (e.g., at the first voltage level) at a voltage level higher than the voltage level of the input signal VIN (e.g., at the third voltage level). A supply voltage VDDH may be received by the first and second inverters 22 and 24. The supply voltage VDDH may be set to the first voltage level (e.g., 3.3V).

Figure 4A:
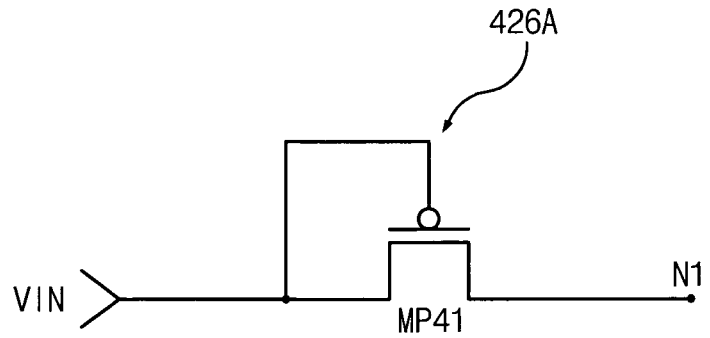
FIG. 4A is a circuit diagram illustrating a protective circuit of a level shifter according to another example embodiment of the present invention.

FIG. 4A is a circuit diagram illustrating a protective circuit 426A of the level shifter 200/300 according to another example embodiment of the present invention.

Figure 4B:
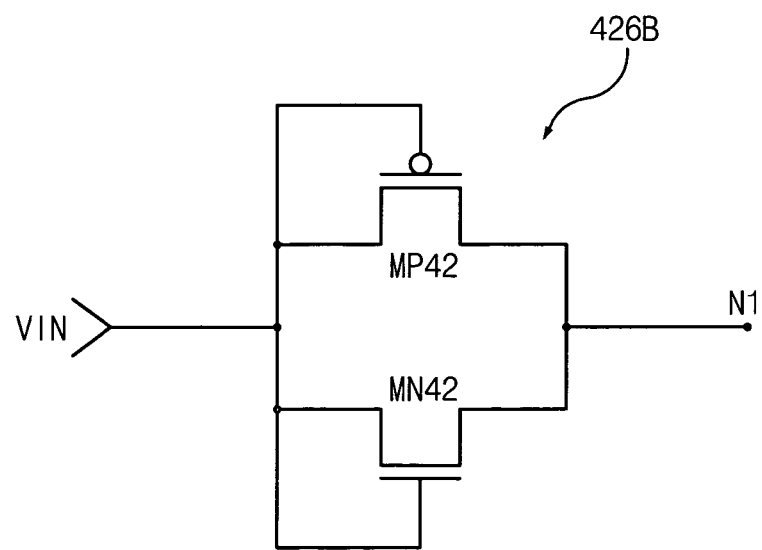
FIG. 4B is a circuit diagram illustrating another protective circuit of a level shifter according to another example embodiment of the present invention.

FIG. 4B is a circuit diagram illustrating the protective circuit 426B of the level shifter 200/300 according to another example embodiment of the present invention.

In the example embodiment of FIG. 4A, the protective circuit 426A may include a diode-connected PMOS transistor MP41. The PMOS transistor MP41 may have a gate and a drain commonly coupled to the input line of the level shifter 200 to receive the input signal VIN and a source coupled to the node N1.

In the example embodiment of FIG. 4B, the protective circuit 426B may include a diode-connected PMOS MP42 and a diode-connected NMOS transistor MN42. The PMOS transistor MP42 and the NMOS transistor MN42 may each have gates and drains commonly coupled to the input line to receive the input signal VIN and sources coupled to the node N1.

An operation of the level shifter 200 of FIG. 2 including one of the protective circuits 426A/426B of FIGS. 4A/4B as the protective circuit 26 will now be described according to another example embodiment of the present invention.

In the example operation of the level shifter 200 of FIG. 2, the input signal VIN may have a voltage level between the second voltage level (e.g., about 0V) and the first voltage level (e.g., about 3.3V) and the output signal VOUT may have a voltage level between about the second voltage level (e.g., about 0V) and the third voltage level (e.g., about 1.2V). In an example, a circuit coupled to an output port of the level shifter 200 of FIG. 2 may use a supply voltage lower than a supply voltage of a circuit coupled to an input port of the level shifter 200. The protective circuit 426A may suppress a voltage surge (e.g., by reducing an input voltage level) in the input signal VIN to output a stabilized voltage to the node N1. The protective circuit 26 illustrated in FIG. 2 may alternatively include the protective circuit 426B of FIG. 4B.

An operation of the level shifter 200 of FIG. 2 including the protective circuit 426A of FIG. 4A as the protective circuit 26 will now be described according to another example embodiment of the present invention.

In the example operation of the level shifter 200 of FIG. 2 including the protective circuit 426A of FIG. 4A as the protective circuit 26, if the input signal VIN is set to the first voltage level (e.g., a higher voltage level, 3.3V, etc. . . . ), the NMOS transistor MN31 may be turned on and the inverted output voltage VOUTB may be set to the second voltage level (e.g., a lower voltage level, 0V, etc. . . . ). The diode-connected PMOS transistor MP41 of the protective circuit 426A may be turned off when the input signal VIN may be set to the first voltage level. Accordingly, both the PMOS transistor MP32 and the NMOS transistor MN32 may be turned off.

In the example operation of the level shifter 200 of FIG. 2 including the protective circuit 426A of FIG. 4A as the protective circuit 26, the first supply voltage (e.g., VDDL) may be received by the first and second inverters 22 and 24 at the third voltage level (e.g. a higher voltage level, 1.2V, equal to a voltage level of the output signal VOUT, etc.). The inverted output signal VOUTB may be set to the second voltage level (e.g., a lower voltage level, 0V, etc.) and the PMOS transistor MP33 of the second inverter 24 may be turned on such that the output signal VOUT may be set to the third voltage level (e.g., 1.2V).

In the example operation of the level shifter 200 of FIG. 2 including the protective circuit 426A of FIG. 4A as the protective circuit 26, the diode-connected PMOS transistor MP41 may protect (e.g., reduce potential damage) the PMOS transistor MP32 and the NMOS transistor MN32 of the first inverter 22, for example from damage incurred by a voltage spike or surge. In an example, if the diode-connected PMOS transistor MP41 as the protective circuit 426A is not included in the level shifter 200 and the first power supply VDDL is set to the third voltage level (e.g., 1.2V) and a surge voltage level (e.g., 5V) is applied to the input line, a gate-to-source voltage of the PMOS transistor MP32 of the first inverter 22 may be set to a fourth voltage level (e.g., 3.8V or other voltage between the surge voltage level and the third voltage level) and a gate-to-source voltage of the NMOS transistor MN32 may be set to the surge voltage level. Gate oxide films of the PMOS transistor MP32 and the NMOS transistor MN32 may be stressed due to the surge voltage level received by the NMOS transistor MN32 and the fourth voltage level (e.g., which may be higher than the first and/or third voltage levels) received by the PMOS transistor MP32.

In the example operation of the level shifter 200 of FIG. 2 including the protective circuit 426A of FIG. 4A as the protective circuit 26, the diode-connected PMOS transistor MP41 may be turned off if the surge voltage is applied to the input line, and the PMOS transistor MP32 and the NMOS transistor MN32 may thereby be protected from the surge voltage level (e.g., which may otherwise damage the NMOS/PMOS transistor MN32/MP32).

In the example operation of the level shifter 200 of FIG. 2 including the protective circuit 426A of FIG. 4A as the protective circuit 26, if the input signal VIN is set to the second voltage level (e.g., 0V), the NMOS transistor MN31 may be turned off and the PMOS transistor MP41 may be turned on. Further, the PMOS transistor MP32 may be turned on and the NMOS transistor MN32 may be turned off. Accordingly, the inverted output voltage VOUTB may be set to the first voltage level (e.g., 3.3V) which may thereby turn on the NMOS transistor MN33 of the second inverter 24. The output voltage VOUT may be set to the second voltage level (e.g., 0V).

An operation of the level shifter 200 of FIG. 2 including the protective circuit 426b of FIG. 4b as the protective circuit 26 will now be described according to another example embodiment of the present invention.

In the example operation of the level shifter 200 of FIG. 2 including the protective circuit 426B of FIG. 4B as the protective circuit 26, the input signal VIN may be set to the first voltage level (e.g., a higher voltage level, 3.3V, etc.), the NMOS transistor MN31 may be turned on and the inverted output voltage VOUTB at the node N2 may be set to the second voltage level (e.g., 0V). If the input signal VIN is set to the first voltage level (e.g., 3.3V), the PMOS transistor MP42 of the protective circuit 426B may be turned off and the NMOS transistor MN42 may be turned on. If the NMOS transistor MN42 has a given threshold voltage level (e.g., 0.5V) lower than the first voltage level (e.g., 3.3V), a fifth voltage level (e.g., 2.8V) between the first voltage level and the given threshold voltage level (e.g., the first voltage level minus the given threshold voltage level) may be applied to the first inverter 22 such that the NMOS transistor MN32 may be turned on and the PMOS transistor MP32 may be turned off.

In another example embodiment of the present invention, if the level shifter 200 of FIG. 2 does not include the protective circuit 26 (e.g., protective circuit 426A of FIG. 4A, protective circuit 426B of FIG. 4B, etc.), a surge voltage (e.g., 5V, a higher voltage than the first voltage level, etc.) may be applied to the input line of the level shifter 200 and an input terminal of the first inverter 22. The surge voltage applied to the PMOS transistor MP32 and the NMOS transistor MN32 of the first inverter 22 may cause stress to the gate oxide films of the transistors MP32 and MN32. In an alternative example, where the level shifter 200 of FIG. 2 may include the protective circuit 426B of FIG. 4B as the protective circuit 26, the protective circuit 426B may protect (e.g., reduce potential damage) the diode-connected transistors MN42 and MP42 (e.g., from being damaged by stress to the gate oxide films due to the higher surge voltage level).

In the example operation of the level shifter 200 of FIG. 2 including the protective circuit 426B of FIG. 4B as the protective circuit 26, if the input voltage VIN is set to a voltage level higher than the first voltage level (e.g., the surge voltage level), the fifth voltage level, which may be the first voltage level minus the given threshold voltage level of the NMOS transistor MN42, may be applied to the first inverter 22. The transistors MP32 and MN32 of the first inverter 22 may thereby be protected from damage due to a voltage spike by the protective circuit 26 (e.g., protective circuit 426A of FIG. 4A, protective circuit 426B of FIG. 4B, etc.).

In the example operation of the level shifter 200 of FIG. 2 including the protective circuit 426B of FIG. 4B as the protective circuit 26, the NMOS transistor MN32 and the PMOS transistor MP32 may be turned on when the input signal VIN is set to the first voltage level (e.g., 3.3V) such that the inverted output signal VOUTB may be set to the second voltage level (e.g., a lower voltage level, 0V, etc.). When the inverted output signal VOUTB is set to the second voltage level, the PMOS transistor MP33 of the second inverter 24 may be turned on such that the output signal VOUT may be set to the third voltage level (e.g., 1.2V).

In the example operation of the level shifter 200 of FIG. 2 including the protective circuit 426B of FIG. 4B as the protective circuit 26, if the input signal VIN is set to the second voltage level (e.g., a lower voltage level, 0V, etc.), the NMOS transistor MN31 may be turned off. The PMOS transistor MP42 may be turned on and the NMOS transistor MN42 may be turned off. The PMOS transistor MP32 of the first inverter 22 may be turned on and the NMOS transistor MN32 may be turned off. The inverted output signal VOUTB may be set to a higher logic level (e.g., the first voltage level, the third voltage level, etc.) and the NMOS transistor MN33 of the second inverter 24 may be turned on. The output signal VOUT may be set to the second logic level (e.g., a lower logic level, 0V, etc.).

In the example embodiment of the level shifter 300 of FIG. 3, the protective circuit 26 may include one of the protective circuit 426A of FIG. 4A and/or the protective circuit 426B of FIG. 4B to protect the level shifter 300 from a voltage surge. The operation of the level shifter 300 of FIG. 3 including the protective circuits 426A/426B may be similar to the above-described operation of the level shifter 200 of FIG. 2 including the protective circuits 426A/426B except for a difference in input and/or output voltage levels.

In the example operation of the level shifter 200/300 of FIGS. 2/3 including the protective circuit 426B of FIG. 4B as the protective circuit 26, the NMOS transistor NM31 need not be included in the level shifter 200/300 of FIGS. 2 and/or 3. However, the NMOS transistor MN31 may be included to decrease a delay time for the inverted output signal VOUTB to transition between voltage levels (e.g., to the first voltage level from the second voltage level, to the second voltage level to the first voltage level, etc.).

Figure 5:
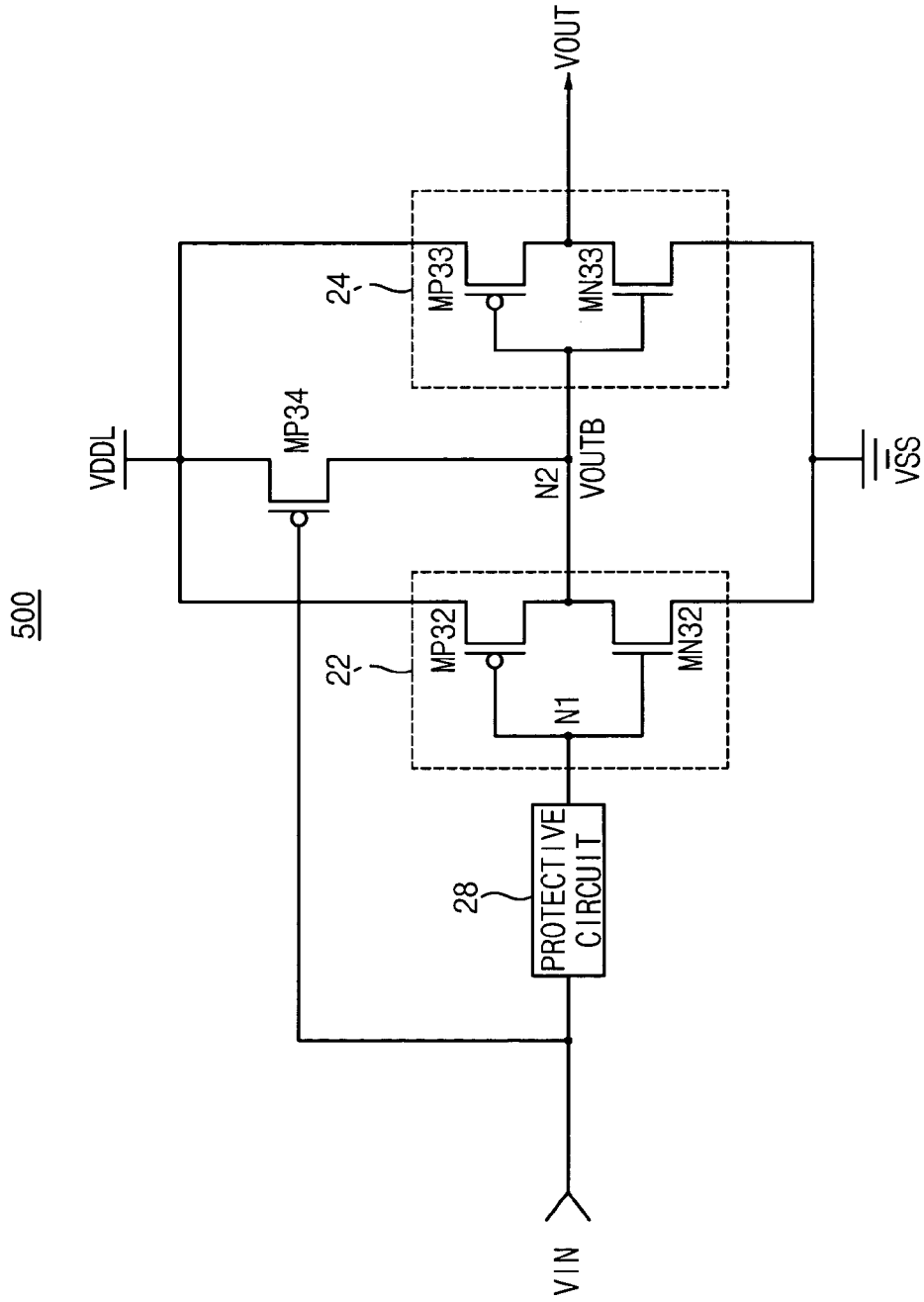
FIG. 5 is a block diagram illustrating a level shifter according to another example embodiment of the present invention.

FIG. 5 is a block diagram illustrating a level shifter 500 according to another example embodiment of the present invention.

In the example embodiment of FIG. 5, the level shifter 500 may output the output signal VOUT at a lower logic level (e.g., between the second voltage level and the third voltage level) than a voltage level of the input signal VIN (e.g., between the first voltage level and the second voltage level).

In the example embodiment of FIG. 5, the level shifter 500 may include a protective circuit 28, a first inverter 22, a second inverter 24 and a PMOS transistor MP34.

In the example embodiment of FIG. 5, the protective circuit 28 may receive the input voltage VIN at an input voltage level (e.g., which may be between the first voltage level and the second voltage level) through an input line and may reduce the input voltage level (e.g., if the input voltage level indicates a voltage spike) of the input signal VIN to output a stabilized voltage at a node N1.

In the example embodiment of FIG. 5, the first inverter 22 may receive and invert an output signal received from the protective circuit 28 and may output the inverted output signal VOUTB (e.g., between the second voltage level and the third voltage level) at a node N2.

In the example embodiment of FIG. 5, the second inverter 24 may receive and invert the inverted output signal VOUTB to output the output signal VOUT (e.g., between the second voltage level and the third voltage level).

In the example embodiment of FIG. 5, the PMOS transistor MP34 may transition a given voltage level (e.g., one of the first voltage level, the second voltage level, etc.) at the node N2 to the second voltage level (e.g., 0V) based on the input signal VIN.

In the example embodiment of FIG. 5, the first inverter 22 may include a PMOS transistor MP32 and an NMOS transistor MN32. The PMOS transistor MP32 may have a gate for receiving the output signal from the protective circuit 28, a source coupled to a first supply voltage and a drain coupled to the node N2. The NMOS transistor MN32 may have a gate for receiving the output signal from the protective circuit 28, a source coupled to a second supply voltage and a drain coupled to the node N2. In an example, the first supply voltage may correspond to the power supply VDDL and the second supply voltage may correspond to the voltage VSS (e.g., a ground voltage).

In the example embodiment of FIG. 5, the second inverter 24 may include a PMOS transistor MP33 having a gate for receiving the inverted output signal VOUTB at the node N2, a source coupled to the first supply voltage (e.g., VDDL) and a drain coupled to the output line. The second inverter 24 may further include an NMOS transistor MN33 having a gate for receiving the inverted output signal VOUTB, a source coupled to the second supply voltage (e.g., VSS) and a drain coupled to the output line.

In the example embodiment of FIG. 5, the first supply voltage (e.g., VDDL) of the level shifter 500 may be set to the third voltage level (e.g., 1.2V) of the output signal VOUT.

Figure 6:
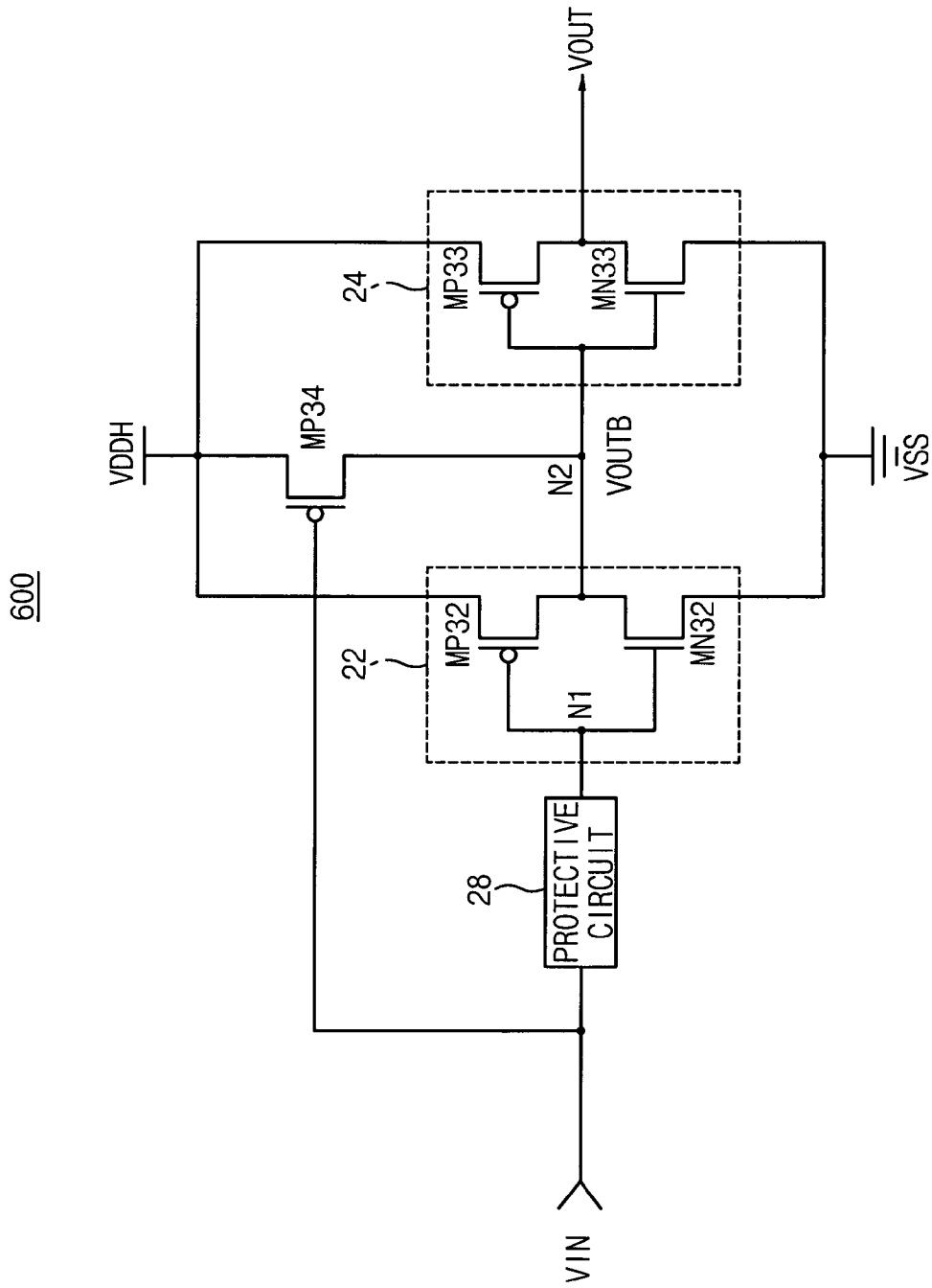
FIG. 6 is a block diagram illustrating a level shifter according to another example embodiment of the present invention.

FIG. 6 is a block diagram illustrating a level shifter 600 according to another example embodiment of the present invention.

In the example embodiment of FIG. 6, the level shifter 600 may output the output signal VOUT at a higher voltage level (e.g., between the first voltage level and the second voltage level) than a voltage level of the input signal VIN (e.g., between the second voltage level and the third voltage level). The level shifter 600 may include the elements of the level shifter 500 as discussed above with respect to FIG. 5 except that the first and second inverters 22 and 24 may receive a supply voltage VDDH which may correspond to the first voltage level (e.g., a higher voltage, 3.3V, etc.).

Figure 7A:
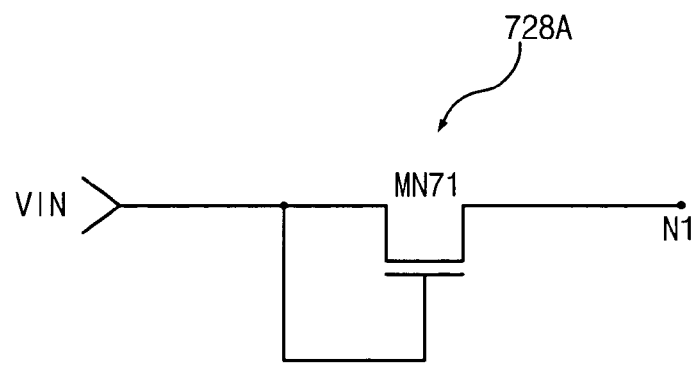
FIG. 7A is a circuit diagram illustrating another protective circuit of a level shifter according to another example embodiment of the present invention.

FIG. 7A is a circuit diagram illustrating a protective circuit 728A of the level shifter 500/600 according to another example embodiment of the present invention.

Figure 7B:
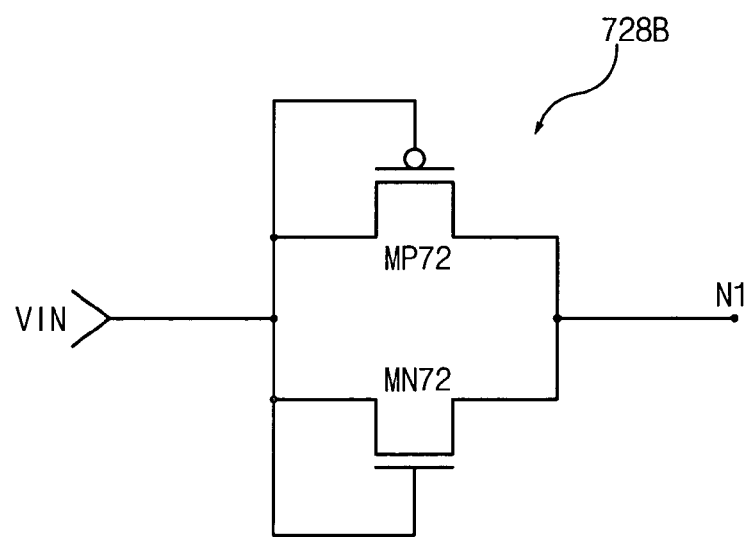
FIG. 7B is a circuit diagram illustrating another protective circuit of a level shifter according to another example embodiment of the present invention.

FIG. 7B is a circuit diagram illustrating the protective circuit 728B of the level shifter 500/600 according to another example embodiment of the present invention.

In the example embodiment of FIG. 7A, the protective circuit 728A may include a diode-connected NMOS transistor MN71. The NMOS transistor MN71 may have a gate and a drain commonly coupled to the input line to receive the input signal VIN and a source coupled to the node N1.

In the example embodiment of FIG. 7B, the protective circuit 728B may include a diode-connected PMOS transistor MP72 and a diode-connected NMOS transistor MN72. The PMOS transistor MP72 and the NMOS transistor MN72 may each include a gate and a drain commonly coupled to the input line to receive the input signal VIN. Sources of the PMOS transistor MP72 and the NMOS transistor MN72 may be coupled to the node N1.

An operation of the level shifter 500 of FIG. 5 including one of the protective circuits 728A/728B of FIGS. 7A/7B as the protective circuit 28 will now be described according to another example embodiment of the present invention.

In the example operation of the level shifter 500 of FIG. 5, the input signal VIN may have an input voltage level between the first voltage level and the second voltage level and the output signal VOUT may have an output voltage level between the second voltage level and the third voltage level. In an example, a circuit coupled to an output port of the level shifter 500 of FIG. 5 may use a supply voltage lower than a supply voltage of a circuit coupled to an input port of the level shifter 500. The protective circuit 728A may suppress a voltage surge in the input signal VIN (e.g., by reducing the input voltage level during a voltage spike) to output a stabilized voltage to the node N1. The protective circuit 28 illustrated in FIG. 5 may alternatively include the protective circuit 728B of FIG. 7B.

An operation of the level shifter 500 of FIG. 5 including the protective circuit 728A of FIG. 7A as the protective circuit 28 will now be described according to another example embodiment of the present invention.

In the example operation of the level shifter 500 of FIG. 5 including the protective circuit 728A of FIG. 7A as the protective circuit 28, if the input signal VIN is set to the second voltage level (e.g., a lower voltage level, 0V, etc.), the PMOS transistor MP34 may be turned on and the inverted output voltage VOUTB may be set to the third voltage level (e.g., a higher voltage level, 1.2V, etc.). The diode-connected NMOS transistor MN71 may be turned off when the input signal VIN is set to the second voltage level (e.g., 0V). Thus, both the PMOS transistor MP32 and the NMOS transistor MN32 may be turned off.

In the example operation of the level shifter 500 of FIG. 5 including the protective circuit 728A of FIG. 7A as the protective circuit 28, the supply voltage VDDL may be received by the first and second inverters 22 and 24. The supply voltage VDDL may correspond to the third voltage level (e.g., 1.2V). The inverted output signal VOUTB may have a higher voltage level (e.g., the first voltage level, the third voltage level, etc.) such that the PMOS transistor MP33 of the second inverter 24 may be turned on and the output signal VOUT may be set to the second voltage level (e.g., 0V).

In the example operation of the level shifter 500 of FIG. 5 including the protective circuit 728A of FIG. 7A as the protective circuit 28, if the input signal VIN is set to the first voltage level (e.g., 3.3V), the PMOS transistor MP34 may be turned off and the diode-connected NMOS transistor MN71 may be turned on. The PMOS transistor MP32 and the NMOS transistor MN32 may be turned on. The inverted output voltage VOUTB may thereby be set to the second voltage level (e.g., a lower voltage level) and the PMOS transistor MP33 of the second inverter 24 may be turned on. The output voltage VOUT may be set to the third voltage level (e.g., 1.2V)

In the example operation of the level shifter 500 of FIG. 5 including the protective circuit 728A of FIG. 7A as the protective circuit 28, the supply voltage VDDL received by the first and second inverters 22 and 24 may be set to the third voltage level (e.g., 1.2V). The inverted output signal VOUTB may be set to the second voltage level (e.g., a lower voltage level, 0V, etc.) such that the PMOS transistor MP33 of the second inverter 24 may be turned on and the output signal VOUT may be set to the third voltage level (e.g., 1.2V).

In the example operation of the level shifter 500 of FIG. 5 including the protective circuit 728A of FIG. 7A as the protective circuit 28, the diode-connected NMOS transistor MN71 may protect (e.g., reduce potential damage) the PMOS transistor MP32 and the NMOS transistor MN32 of the first inverter 22 if the input line is set to the surge voltage level (e.g., 5V or higher, higher than the first voltage level, etc.).

In an example where the level shifter 500 of FIG. 5 does not include the protective circuit 28 and the surge voltage level (e.g., 5V) is applied to the input line, a voltage spike may be applied to the first inverter 22. Thus, a higher voltage level (e.g., higher than the first voltage level) may be applied to respective gates of the PMOS transistor MP32 and the NMOS transistor MN32 of the first inverter 22 which may cause stress to the gate oxide films thereof.

In the example operation of the level shifter 500 of FIG. 5 including the protective circuit 728A of FIG. 7A as the protective circuit 28, the diode-connected NMOS transistor MN71 may protect the transistors MN32 and MP32 from a voltage spike. Further, if the input voltage level of the input voltage VIN is higher than the first voltage level (e.g., the surge voltage level, higher than 3.3V, etc.), the fourth voltage level (e.g., the input voltage level of the input signal VIN minus the given threshold voltage level of the NMOS transistor MN71) may be applied to the first inverter 22 such that the transistors MP32 and MN32 of the first inverter 22 may be protected from the voltage spike.

An operation of the level shifter 500 of FIG. 5 including the protective circuit 728B of FIG. 7B as the protective circuit 28 will now be described according to another example embodiment of the present invention.

In the example operation of the level shifter 500 of FIG. 5 including the protective circuit 728B of FIG. 7B as the protective circuit 28, if the input signal VIN is set to the first voltage level (e.g., 3.3V), the PMOS transistor MP34 may be turned on and the inverted output voltage VOUTB at the node N2 may be set to the third voltage level (e.g., 1.2V). The protective circuit 728B may include the diode-connected PMOS MP72 and the diode-connected NMOS transistor MN72, which may be coupled to each other in parallel. If the input signal VIN is set to the second voltage level (e.g., 0V), the PMOS transistor MP72 may be turned on and the NMOS transistor MN72 may be turned off. If the PMOS transistor MP72 has a given threshold voltage level (e.g., 0.5V), the given threshold voltage level may be applied to the first inverter 22. The PMOS transistor MP32 may be turned on and the NMOS transistor MN32 may be turned off.

In the example operation of the level shifter 500 of FIG. 5 including the protective circuit 728B of FIG. 7B as the protective circuit 28, both the NMOS transistor MN32 and the PMOS transistor MP34 may be turned on such that the inverted output signal VOUTB may be set to a higher voltage level (e.g., the first voltage level, the third voltage level, etc.). If the inverted output signal VOUTB is set to the higher voltage level, the NMOS transistor MN33 of the second inverter 24 may be turned on such that the output signal VOUT may be set to the second voltage level (e.g., 0V).

In the example operation of the level shifter 500 of FIG. 5 including the protective circuit 728B of FIG. 7B as the protective circuit 28, if the input signal VIN is set to the first voltage level (e.g., 3.3V), the PMOS transistor MP34 may be turned off. The PMOS transistor MP72 of the protective circuit 728B may be turned off and the NMOS transistor MN72 may be turned on. The PMOS transistor MP32 of the first inverter 22 may be turned off and the NMOS transistor MN32 may be turned on. The inverted output signal VOUTB may be set to the second voltage level (e.g., 0V) and the PMOS transistor MP33 of the second inverter 24 may be turned on. The output signal VOUT may be set to the third voltage level (e.g., 1.2V).

In another example, if the level shifter 500 of FIG. 5 does not include the protective circuit 28 and the surge voltage level (e.g., 5V) is applied to the input line, a voltage spike may be received at an input terminal of the first inverter 22. The surge voltage level applied to gate electrodes of the PMOS transistor MP32 and the NMOS transistor MN32 of the first inverter 22 may cause stress to the gate oxide films thereof. Alternatively, the diode-connected transistors MN72 and MP72 may be protected from voltage stress damage to the gate oxide films with the protective circuit 728B in FIG. 7B.

In the example operation of the level shifter 500 of FIG. 5 including the protective circuit 728B of FIG. 7B as the protective circuit 28, if the input voltage VIN is higher than the first voltage level (e.g., the surge voltage level), the fourth voltage level (e.g., the higher voltage level of the input signal VIN minus the given threshold voltage level for the NMOS transistor MN72) may be applied to the first inverter 22. The PMOS/NMOS transistors MP32 and MN32 of the first inverter 22 may thereby be protected from higher voltage levels by the diode-connected NMOS transistor MN72 of the protective circuit 728B.

In another example embodiment of the present invention, either of the protective circuits 728A and 728B of FIGS. 7A and 7B, respectively, may be used as the protective circuit 28 in the level shifter 600 of FIG. 6 to reduce damage incurred from a voltage spike or surge (e.g., as described above with respect to the example operation of FIG. 5).

In the example operation of the level shifter 500/600 of FIGS. 5/6 including the protective circuit 728B of FIG. 7B as the protective circuit 28, the PMOS transistor MP34 need not be included in the level shifter 500/600. However, the PMOS transistor MP34 may be included to decrease a delay time for the inverted output signal VOUTB to transition between voltage levels (e.g., to the first voltage level from the second voltage level to, to the second voltage level from the first voltage level, etc.).

Figure 8A:
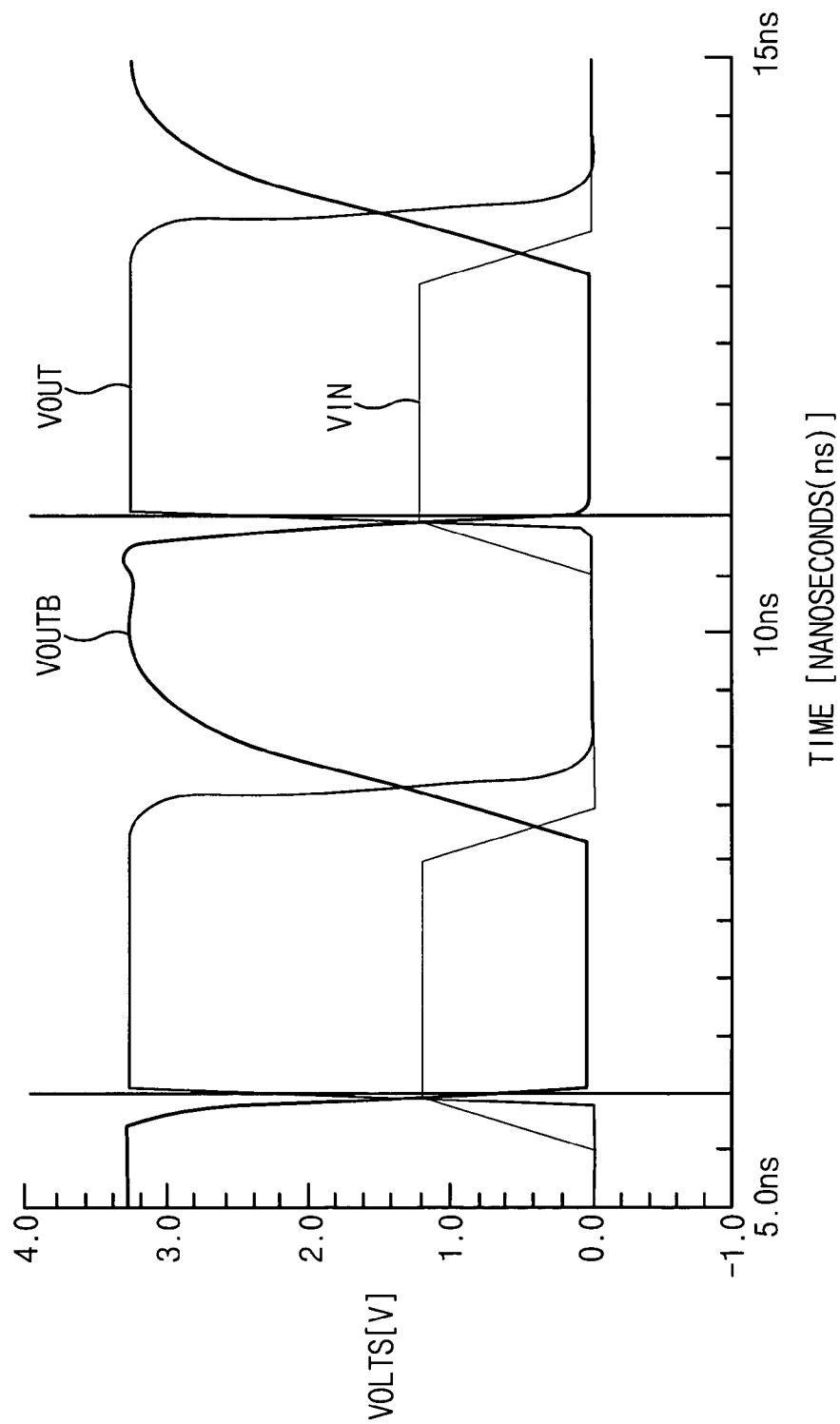
FIGS. 8A-8D illustrate simulation results for level shifters according to other example embodiments of the present invention.
Figure 8B:
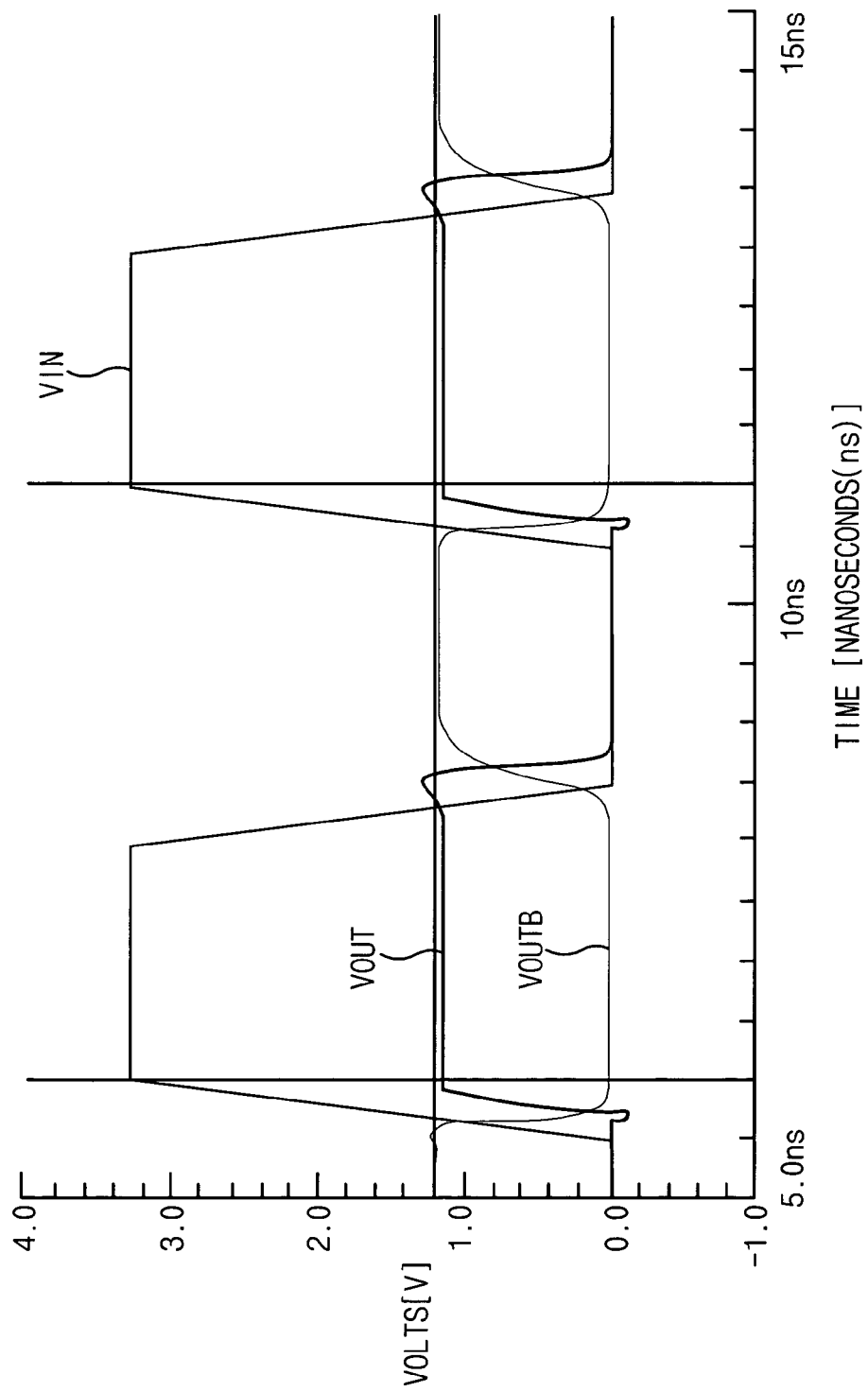
Figure 8C:
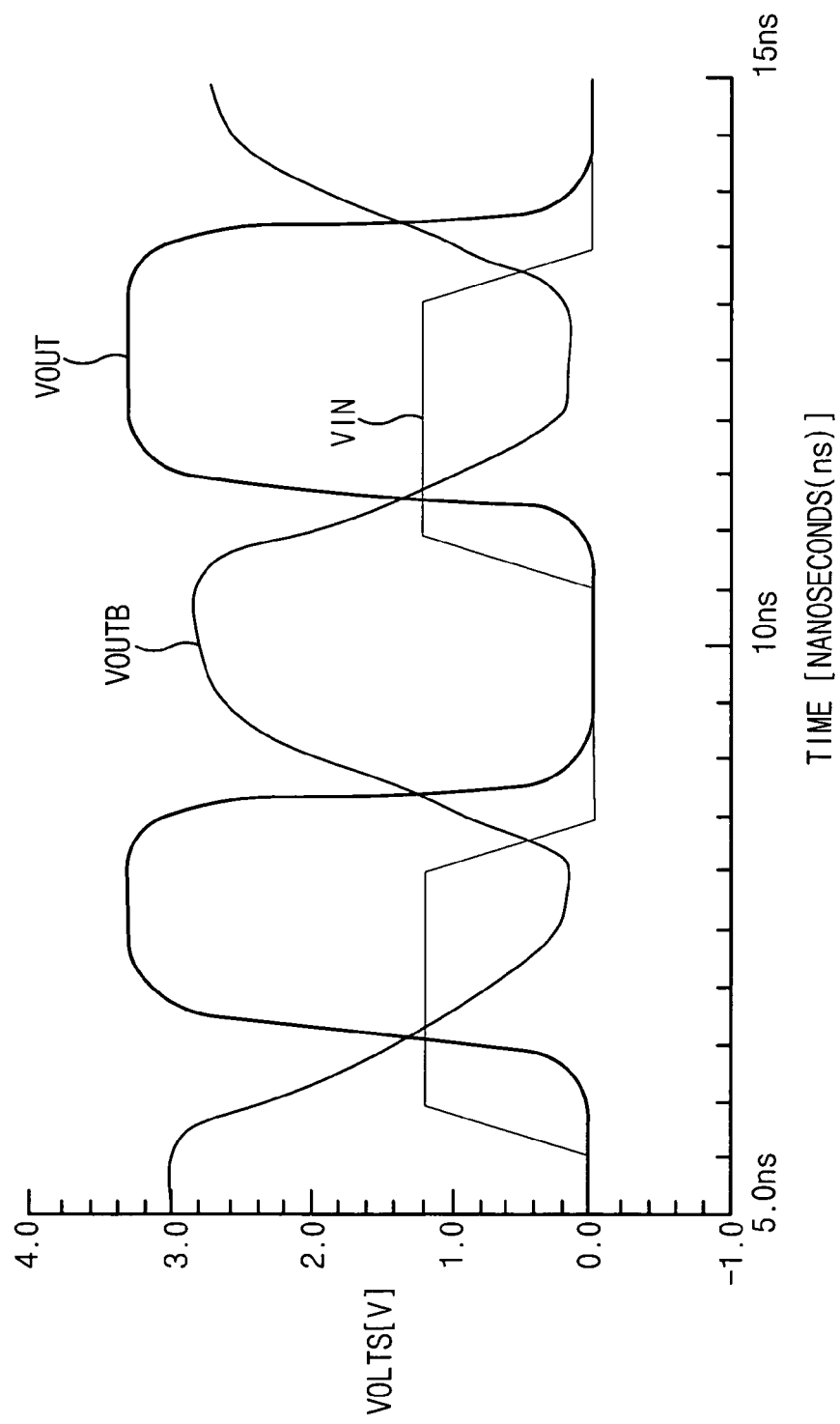
Figure 8D:
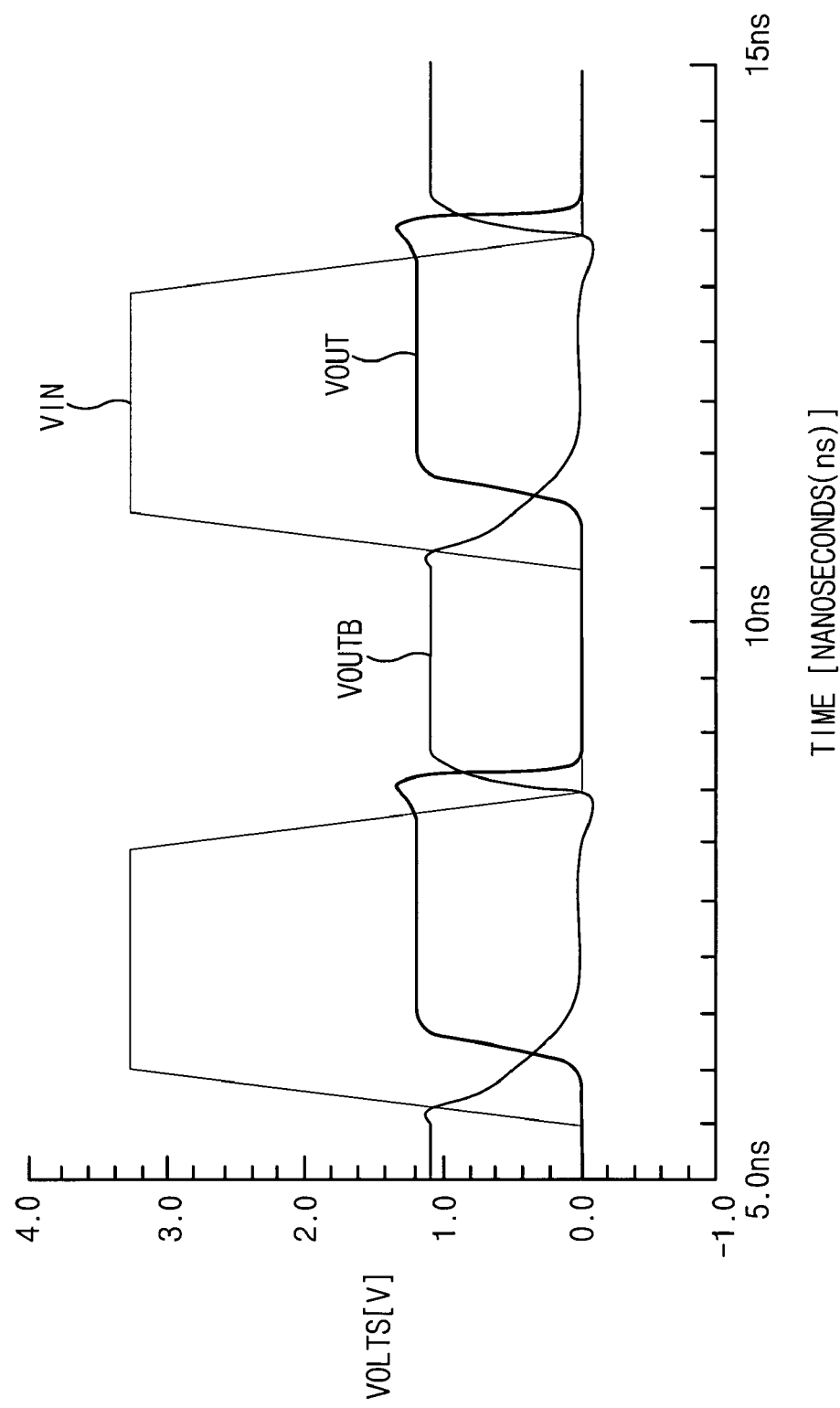

FIGS. 8A-8D illustrate simulation results for the level shifters 200/300/500/600 according to other example embodiments of the present invention. In the example embodiments of FIGS. 8A-8D, the input signal VIN may be set to have a frequency of 200 MHz and a voltage transition time equal to a tenth of the period of the input signal VIN. With the above assumptions, FIGS. 8A and 8B illustrate waveforms of the input signal VIN and the output signals VOUT/VOUTB of the level shifters 300 and 200 of FIGS. 3 and 2, respectively, and FIGS. 8C and 8D illustrate waveforms of the input signal VIN and the output signals VOUT/VOUTB of the level shifters 600 and 500 of FIGS. 6 and 5, respectively.

In the example embodiments of FIGS. 8A and 8C, a voltage level of the output signal VOUT may be higher than a voltage level of the input signal VIN. In the example embodiments of FIGS. 8B and 8D, the voltage level of the input signal VIN may be higher than the voltage level of the output signal VOUT. FIGS. 8A-8D illustrate that an input signal (e.g., input signal VIN) having a given frequency (e.g., 200 MHz) may transition from a first voltage level (e.g., a higher voltage level) to a second voltage level (e.g., a lower voltage level) or vice versa with any of the level shifters 200/300/500/600 of FIGS. 2/3/5/6 including any of the protective circuits 426A/426B/728A/728B of FIGS. 4A/4B/7A/7B according to example embodiments of the present invention.

In another example embodiment of the present invention, a level shifter (e.g., level shifter 200, 300, 500, 600, etc.) may have a lower design complexity and may thereby occupy a smaller chip area on a semiconductor integrated circuit (IC). The reduced complexity and/or chip size associated with level shifters according to example embodiments of the present invention may further reduce a power consumption of the semiconductor IC.

Example embodiments of the present invention being thus described, it will be obvious that the same may be varied in many ways. For example, while the first, second, third, fourth and fifth voltage levels are above described as being 3.3V, 0V, 1.2V, 3.8V and 3.2V, respectively, it is understood that these voltages are given for example purposes only and other example embodiments of the present invention may include other voltage levels associated with each of the first, second, third, fourth and fifth voltage levels.

Further, while the above described level shifters 200/300/500/600 are illustrated as including a single protective circuit 26/28, it is understood that other example embodiments of the present invention may include one or more protective circuits 26/28. For example, the protective circuit 426A and 426B may be arranged in series in the protective circuit 26 in either of FIGS. 2 and 3. Other variations to the protective circuit will be readily apparent to one skilled in the art.

Further, in another example embodiment of the present invention, the protective circuit 426B of FIG. 4B and/or the protective circuit 728B of FIG. 4B may be rectifying diodes.

Further, it is understood that other example embodiments of the present invention may employ the protective circuits 26/28 in circuits other than a level circuit. Likewise, it is understood that other example embodiments of the present invention may employ a level circuit with other protective circuits and/or without a protective circuit. Further, it is understood that all specific voltages are given in above-described example embodiments of the present invention as examples only, and may be adjusted to other voltages in other example embodiments of the present invention.

Such variations are not to be regarded as departure from the spirit and scope of example embodiments of the present invention, and all such modifications as would be obvious to one skilled in the art are intended to be included within the scope of the following claims.

What is claimed is:

1. A level shifter, comprising:
   a protective circuit configured to receive an input signal having an input voltage level, the input signal received on an input line, the protective circuit having an input terminal and an output terminal, the protective circuit selectively reducing the input voltage level to generate a stabilized input signal if the input voltage level exceeds a threshold voltage level, the threshold voltage level being greater than a power supply voltage of the level shifter;
   a first inverter configured to invert the stabilized input signal to output an inverted output signal at an inverted output voltage level to a first node, the first inverter having an input terminal; and
   a switching element configured to transition the first node to the second voltage level based on the input voltage level of the input signal, the switching element having a control terminal;
   wherein the input voltage level is between a first voltage level and a second voltage level and the inverted output voltage level is between the second voltage level and a third voltage level, the control terminal of the switching element is coupled to the input terminal of the protective circuit, and the input terminal of the first inverter is coupled to the output terminal of the protective circuit.

2. The level shifter of claim 1, wherein the protective circuit includes a rectifying diode.

3. The level shifter of claim 1, wherein the stabilized input signal is generated based on a transistor threshold voltage for one of a PMOS transistor and an NMOS transistor.

4. The level shifter of claim 1, wherein the protective circuit includes:
   a PMOS transistor having a first current electrode coupled to the input terminal of the first inverter and a control electrode and a second current electrode commonly coupled to the input line.

5. The level shifter of claim 1, wherein the protective circuit includes:
   a PMOS transistor having a first current electrode coupled to the input terminal of the first inverter and a control electrode and a second current electrode commonly coupled to the input line; and
   an NMOS transistor having a first current electrode coupled to the input terminal of the first inverter and a control electrode and a second current electrode commonly coupled to the input line.

6. The level shifter of claim 1, further comprising:
   a second inverter configured to receive and invert the inverted output signal to output a non-inverted output signal having a non-inverted output voltage level.

7. The level shifter of claim 6, wherein the non-inverted output voltage level is between the second voltage level and the third voltage level.

8. The level shifter of claim 6, wherein the second inverter operates based on a first supply voltage corresponding to the third voltage level and a second supply voltage corresponding to the second voltage level.

9. The level shifter of claim 8, wherein the second inverter includes:
   a PMOS transistor having a control electrode receiving the inverted output signal, a first current electrode coupled to the first supply voltage and a second current electrode coupled to the output line; and
   an NMOS transistor having a control electrode receiving the inverted output signal, a first current electrode coupled to the second supply voltage and a second current electrode coupled to the output line.

10. The level shifter of claim 1, wherein the first voltage level is higher than the third voltage level and the third voltage level is higher than the second voltage level.

11. The level shifter of claim 10, wherein the first voltage level is about 3.3 Volts, the second voltage level is about 0 Volts and the third voltage level is about 1.2 Volts.

12. The level shifter of claim 1, wherein the third voltage level is higher than the first voltage level and the first voltage level is higher than the second voltage level.

13. The level shifter of claim 12, wherein the first voltage level is about 1.2 Volts, the second voltage level is about 0 Volts and the third voltage level is about 3.3 Volts.

14. The level shifter of claim 1, wherein the switching element includes a MOS transistor having a gate coupled to the input line, a first current electrode coupled to a supply voltage corresponding to the second voltage level and a second current electrode coupled to the first node.

15. The level shifter of claim 1, further comprising:
   a switching element configured to transition the first node to the third voltage level based on the input voltage level of the input signal.

16. The level shifter of claim 15, wherein the switching element includes a MOS transistor having a gate coupled to the input line, a first current electrode coupled to a supply voltage corresponding to the third voltage level and a second current electrode coupled to the first node.

17. The level shifter of claim 1, wherein the first inverter operates based on a first supply voltage corresponding to the third voltage level and a second supply voltage corresponding to the second voltage level.

18. The level shifter of claim 17, wherein the first inverter includes:
   a PMOS transistor having a control electrode receiving the stabilized input signal, a first current electrode coupled to the first supply voltage and a second current electrode coupled to the first node; and
   an NMOS transistor having a control electrode receiving the stabilized input signal, a first current electrode coupled to the second supply voltage and a second current electrode coupled to the first node.

19. The level shifter of claim 1, wherein the input voltage level reaches a surge voltage level higher than each of the first, second and third voltage levels.

20. A method of level shifting, comprising:
   receiving an input signal at an input voltage level on an input line coupled to an input terminal of a protective circuit and an input terminal of a switching element;
   selectively reducing the input voltage level by using the protective circuit to output a stabilized input signal if the input voltage level exceeds a threshold voltage level, the threshold voltage level being greater than a power supply voltage of a level shifter;
   outputting the stabilized input signal from an output terminal of the protective circuit coupled to an input terminal of an inverter;
   inverting the stabilized input signal by using the inverter to output an inverted output signal at an inverted output voltage level to a first node; and
   transitioning the first node to a node voltage level based on the input signal by using the switching element.

21. The method of claim 20, wherein the input voltage level is between a first voltage level and a second voltage level and the inverted output voltage level is between the second voltage level and a third voltage level.

22. The method of claim 21, further comprising:
   inverting the inverted output signal to output a non-inverted output signal having a non-inverted output voltage level.

23. The method of claim 22, wherein the non-inverted output voltage level is between the second voltage level and the third voltage level.

24. The method of claim 21, wherein the third voltage level is lower than the first voltage level.

25. The method of claim 24, wherein the first voltage level is about 3.3 Volts, the second voltage level is about 0 Volts and the third voltage level is about 1.2 Volts.

26. The level shifter of claim 21, wherein the third voltage level is higher than the first voltage level.

27. The method of claim 26, wherein the first voltage level is about 1.2 Volts, the second voltage level is about 0 Volts and the third voltage level is about 3.3 Volts.

28. The method of claim 21, wherein the node voltage level corresponds to the second voltage level.

29. The method of claim 21, wherein the node voltage level corresponds to the third voltage level.

30. The method of claim 20, wherein the stabilized input signal is generated using a rectifying diode.

31. The method of claim 20, wherein the stabilized input signal is generated using a transistor threshold voltage for one of a NMOS transistor and a PMOS transistor.

32. A level shifter for performing the method of claim 20.

* * * * *